United States Patent [19]

Chow

[11] 3,998,673
[45] Dec. 21, 1976

[54] METHOD FOR FORMING ELECTRICALLY-ISOLATED REGIONS IN INTEGRATED CIRCUITS UTILIZING SELECTIVE EPITAXIAL GROWTH

[76] Inventor: Pel Chow, 539 Keelson Circle, Redwood City, Calif. 94065

[22] Filed: Aug. 16, 1974

[21] Appl. No.: 498,011

[52] U.S. Cl. .............................. 148/175; 29/571; 29/580; 156/17; 357/40; 357/41; 357/44; 357/49; 357/50
[51] Int. Cl.² .................. H01L 21/76; H01L 21/20
[58] Field of Search .................... 148/175; 156/17; 29/571, 580; 357/49, 50

[56] References Cited

UNITED STATES PATENTS

| | | | |
|---|---|---|---|
| 3,296,040 | 1/1967 | Wigton | 148/175 |
| 3,386,865 | 6/1968 | Doo | 148/175 |
| 3,416,224 | 12/1968 | Armstrong et al. | 29/580 |
| 3,432,919 | 3/1969 | Rosvold | 29/580 X |
| 3,500,139 | 3/1970 | Frouin et al. | 148/175 X |
| 3,559,283 | 2/1971 | Kravitz | 29/580 X |
| 3,579,057 | 5/1971 | Stoller | 357/49 X |
| 3,738,877 | 6/1973 | Davidsohn | 148/175 |
| 3,784,847 | 1/1974 | Kurz et al. | 357/50 X |
| 3,818,289 | 6/1974 | Mudge et al. | 357/49 |
| 3,861,968 | 1/1975 | Magdo et al. | 148/175 |
| 3,883,948 | 5/1975 | Allison | 29/580 X |
| 3,886,000 | 5/1975 | Bratter et al. | 148/175 |
| 3,892,608 | 7/1975 | Kuhn | 148/175 X |

OTHER PUBLICATIONS

"VIP for Bipolars : Dielectric Isolation," Electronics, July 3, 1972, pp. 39–40.
Sanders et al., "Improved Dielectric–Junction . . . Circuits," Technical Digest, 1973 Internat. Electron Devices Mtg., Dec. 1973, pp.38–40.
Sanders et al., "Polysilicon–Filled Notch . . . Bipolar Memory," Electronics, Apr. 12, 1973, pp. 117–120.
Davidsohn et al., "Dielectric Isolated . . . Substrate Processes," Proc. IEEE, vol. 57, No. 9, Sept. 1969, pp. 1532–1537.

Primary Examiner—L. Dewayne Rutledge
Assistant Examiner—W. G. Saba
Attorney, Agent, or Firm—Townsend and Townsend

[57] ABSTRACT

An improved process for forming electrically-isolated regions in integrated circuits in the form of dielectric moats surrounding the regions and P-N junctions underlying the regions. Moats or notches are etched into the substrate prior to the formation of the buried isolation layer or further device information. A dielectric material such as silicon dioxide is deposited in the notches or moats and polycrystalline silicon is thereafter grown on the surface of the wafer to fill the notches or moats. The excess polysilicon formed on the surface of the wafer is then removed by mechanical lapping or polishing. Since there has been no doping or epitaxial growth, the wafer may be lapped directly to the substrate to remove all of the polysilicon and oxide from the surface while leaving the notches or moats lined with dielectric material and filled with polysilicon. There is thus no criticality to the lapping operation.

7 Claims, 13 Drawing Figures

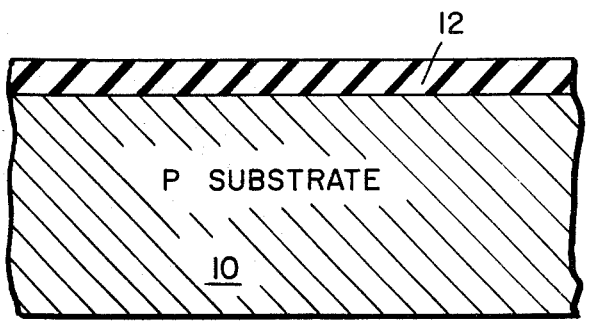
FIG _ 1a
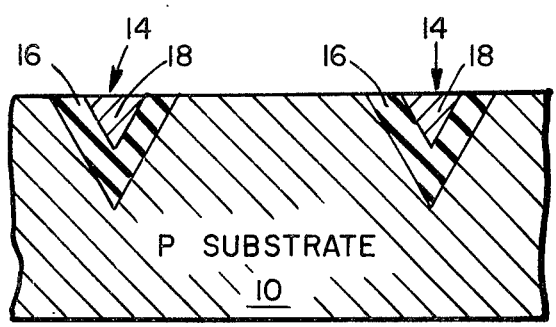
FIG _ 1e
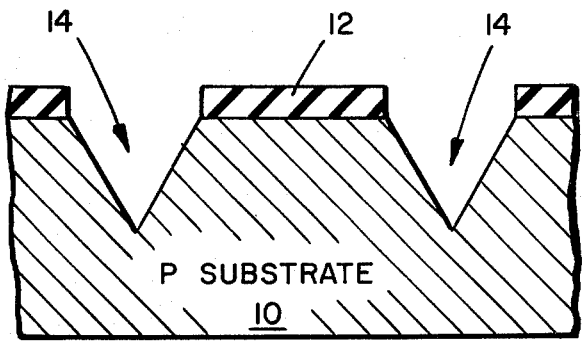
FIG _ 1b
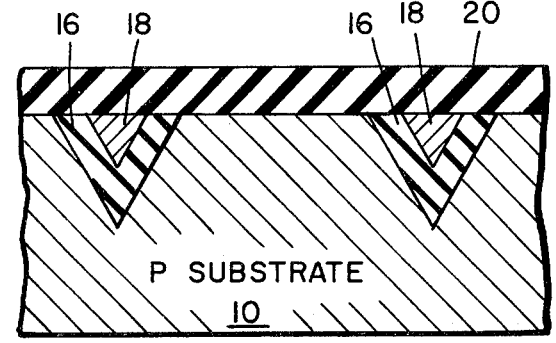
FIG _ 1f
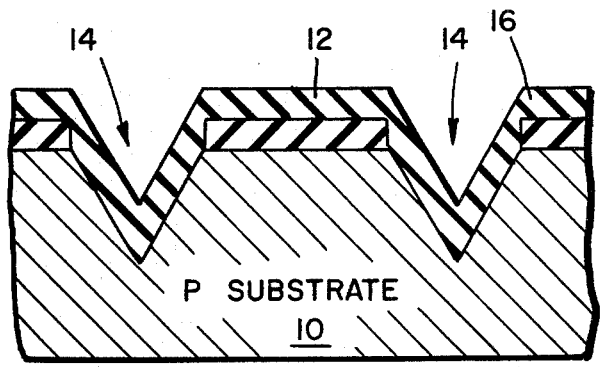
FIG _ 1c
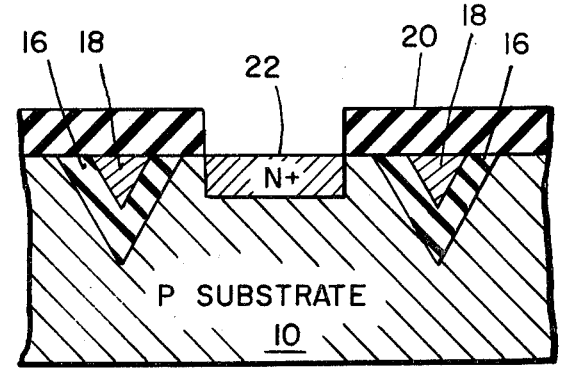
FIG _ 1g
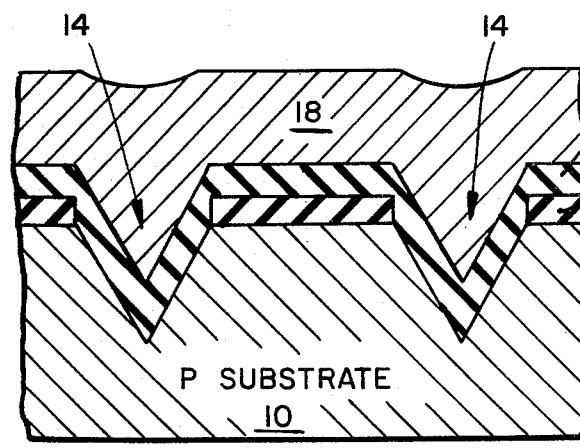
FIG _ 1d
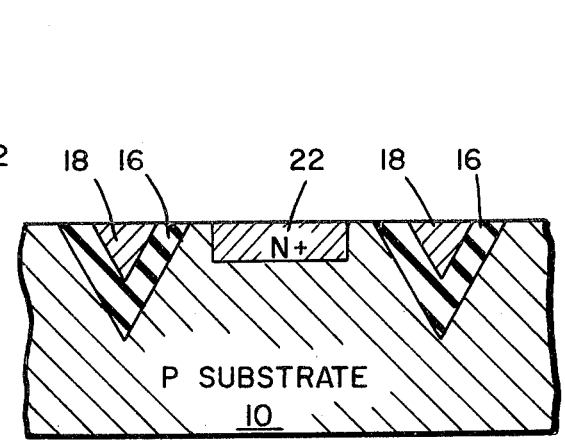
FIG _ 1h

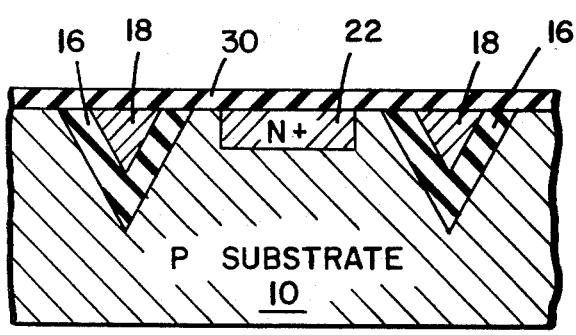
FIG_1i
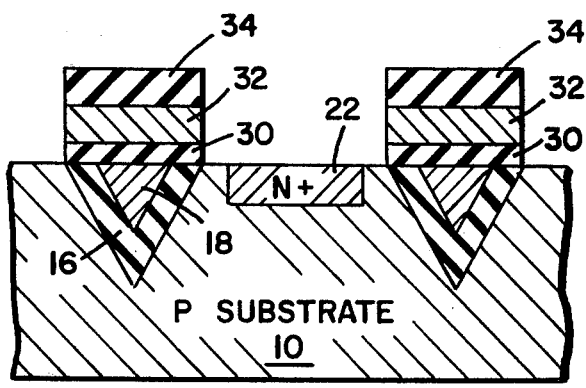
FIG_1l
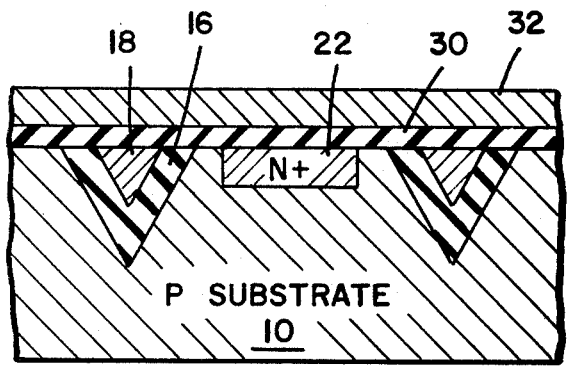
FIG_1j
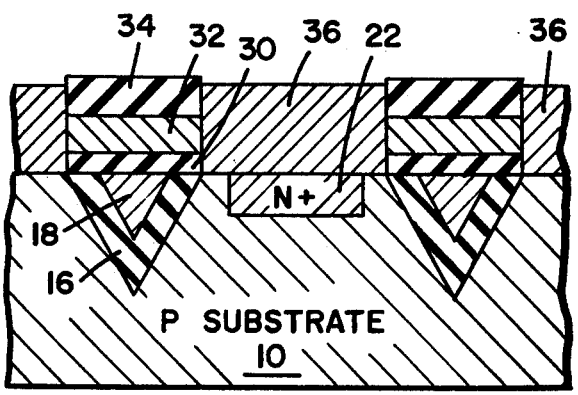
FIG_1m
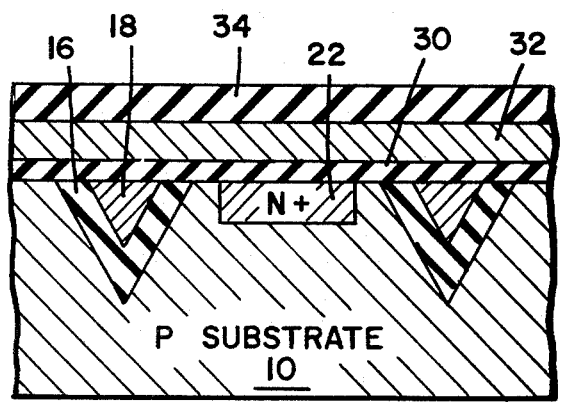
FIG_1k

METHOD FOR FORMING ELECTRICALLY-ISOLATED REGIONS IN INTEGRATED CIRCUITS UTILIZING SELECTIVE EPITAXIAL GROWTH

The present invention relates to the fabrication of integrated circuits, and more particularly, to a method for forming electrically-isolated regions in integrated circuits.

Prior Art

Integrated circuits generally comprise an array of discrete active semiconductor devices, typically transistors, on a unitary substrate and suitable interconnections in the form of conductive paths and passive elements. It is frequently essential to electrically isolate the various discrete semiconductor devices from one another. With the advent large scale integration (LSI), the packing density of the semiconductor devices on the substrate or chip has beome paramount. Thus, the technique employed to provide the required isolation preferably devotes a minimum of chip area to this function. Moreover, the isolation technique should be simple, reliable and compatible with conventional integrated circuit processing, so as not to diminish the yield of the circuits produced. In addition, the isolation technique should preferably result in a chip surface which is relatively planar, to facilitate the deposition of metal interconnections on the surface of the chip and render such interconnections more reliable.

The prior art has primarily employed two basic isolation processes; junction isolation and dielectric isolation. Junction isolation typically provides a reverse-biased P-N junction region surrounding and underlying the semiconductor device to isolate it from the substrate and adjacent devices. Since the isolating junctions are formed by diffusion, there is considerable side or lateral diffusion which severely limits the achievable packing densities.

Dielectric isolation generally provides an insulating material, typically silicon dioxide, surrounding and underlying the semiconductor devices. In essence, the semiconductor devices are formed on islands dielectrically insulated from the substrate. While the available packing densities are generally higher than those achieved with junction isolation, dielectric isolation processes are generally unduly expensive and complex and do not provide the desired high packing density.

Recently, isolation techniques have been developed which combine the attributes of junction and dielectric isolation. Typical of these processes are the Motorola VIP process, the Harris Polyplanar process, the Isoplanar process and the V-ATE process. Generally, these processes employ isolating junctions underlying the semiconductor devices and dielectric isolation in the form of a moat or notch surrounding the semiconductor devices. The moat or notch is typically lined with a dielectric material such as silicon dioxide and backfilled with a second material such as polycrystalline silicon to render the surface of the chip generally planar. Unfortunately, the processing employed to achieve such isolation structures is unduly critical and has resulted in undesirably low yields.

Specifically, the processing adapted to achieve such isolation typically commences with a monocrystalline silicon chip or wafer of a first conductivity. The wafer is selectively doped to form regions of the opposite or second conductivity which eventually underlie the semiconductor devices, providing the desired underlying junction isolation. Next, an epitaxial layer of semiconductor material of the second conductivity is grown on the surface of the wafer. Eventually, the semiconductor devices are formed in this epitaxial layer. Next, notches or moats are etched around the sites of the semiconductor devices and a layer of dielectric material such as silicon dioxide nitrate is grown to provide the desired lateral or sideways dielectric isolation. Polysilicon is then deposited on the wafer to fill the moats for the purpose of rendering the surface of the wafer generally planar. At this point, however, polysilicon overlying the dielectric covers the entire surface of the wafer and the excess polysilicon and dielectric must be removed to expose the surface of the sites of the semiconductor devices for further processing. This is accomplished by a mechanical lapping or polishing operation which is particularly critical. Specifically, any error in parallelism between the polishing plates and/or the surfaces of the wafer will result in the lapping of a surface inclined with respect to the initial surface of the wafer. Thus, in certain areas of the wafer excess polysilicon may remain while in other areas the polishing may have extended into or beyond the epitaxial layer. Accordingly, excess polysilicon may remain on certain semiconductor device sites while the epitaxial layer of other semiconductor device sites may have been destroyed. In either event, further processing to form the semiconductor devices will be ineffectual. Thus, the criticality of the mechanical lapping or polishing operation severely detracts from the yield of the process.

BRIEF SUMMARY OF INVENTION

The process of the present invention overcomes this major drawback while providing semiconductor regions similarly isolated by a lateral dielectric moat and an underlying P-N junction. Specifically, according to the process of the present invention, moats or notches are etched into the substrate prior to the formation of the buried isolation and epitaxial layers. A dielectric material such as silicon dioxide is deposited in the notches or moats and polysilicon is thereafter grown on the surface of the wafer to fill the notches or moats. The excess polysilicon formed on the surface of the wafer is then removed by mechanical lapping or polishing. Since there has been no doping or epitaxial growth, the wafer may be lapped directly to the substrate to remove all of the polysilicon and oxide from the surface while leaving the notches or moats lined with dielectric material and filled with polysilicon. There is thus no criticality of the lapping operation. Small errors in the parallelism of the lapping are permissible as the wafer is lapped directly to the substrate. Such minor polishing away of the substrate as may occur will merely slightly diminish the depth of the dielectric moat. As will be more readily apparent hereinafter, the depth of the dielectric moat is not critical as the process of the present invention disposes the junction isolation layer relatively close to the surface of the wafer.

After lapping, the wafer is selectively doped to the opposite conductivity at the sites of the semiconductor devices within the interiors of the dielectric moats to form the junction isolation regions. Thereafter, an epitaxial layer of the second conductivity semiconductor material is grown on the junction isolation regions and dielectric material is added on the surface of the moats to maintain planarity and lateral dielectric isolation.

It is thus apparent that the process of the present invention eliminates the criticality of the mechanical lapping operation of the prior art to achieve generally similar isolated regions defined by surrounding dielectric isolation moats and underlying junction isolation layers. In addition, the specific structure formed by the present invention is advantageous with respect to that formed in accordance with the prior art. Specifically, according to the prior art isolation techniques of this type, the buried isolation layer is disposed at the bottom or apex of the moat, while in the present invention the buried isolation layer is closer to the top or surface of the dielectric moat. Moreover, when an anistropic etch is employed to form the notches or moats, as is generally preferable, the processes of the prior art produce notches of a V-shaped cross-section. In contrast, the notches of the present invention will have V-shaped lower apices, but will have vertical sidewalls above the initial surface of the substrate. Thus, the dielectric notches of the present invention, may be somewhat narrower than those of the prior art, thereby enabling greater packing densities.

BRIEF DESCRIPTION OF DRAWINGS

These and other objects, features and advantages of the present invention will be more readily apparent from the following detailed description, wherein reference is made to the accompanying drawings in which:

FIGS. 1a through 1m are a cartoon series of side cross-sectional views of a portion of a semiconductor wafer fabricated in accordance with the process of the present invention.

DETAILED DESCRIPTION OF INVENTION

Referring now to FIGS. 1a through 1m, the method for forming isolated regions in integrated circuits according to the present invention will now be described in detail. The present invention is applicable to diverse types of integrated circuits including bipolar circuits, MOSFET circuits and CMOS circuits. In the preferred embodiment of the present invention to be described herein, the environment contemplated is a bipolar integrated circuit. However, it is to be expressly understood that the isolation process of the present invention may readily be employed in other types of integrated circuits, the bipolar technology being described herein for illustrative purposes only.

Referring initially to FIG. 1a, the process of the present invention is commenced upon a moncrystalline silicon substrate 10. In the peferred embodiment depicted in FIGS. 1a through 1m NPN transistors are to be formed on isolated regions. Thus, the initial doping of the substrate 10 is of the P polarity. The initial step of the present invention is the growth of an oxide layer 12 on the upper surface of the substrate 10. Oxide layer 12 is employed as a mask for the etching of the dielectric isolation moats, in a conventional manner. Thus, a pattern of openings defining the desired dielectric isolation moats around the transistor sites is etched in the oxide layer 12 using conventional photo-resist and etch techniques to form an oxide mask having openings corresponding to the desired moats or notches as illustrated in FIG. 1b.

Moats or notches 14 are then etched into the substrate 10 through the apertures in oxide mask 12 in a conventional manner. The width of the moats 14 is preferably about 0.2 mil while the depth of the moats 14 is preferably about 0.36 mil. The cross-sectional configuration of the moats 14 is not critical to the present invention. However, it is preferable to orient the substrate in the 1-0-0 crystal orientation so that the etching may be accomplished anisotropically to define moats 14 of V-shaped cross-section with the base of the V on the upper surface of the substrate 10 and the apices interior thereof. The principal advantage of the anisotropic etch is that it is self-stopping, the depth of the moats 14 being determined by the width of the apertures in mask 12. Thus, the anisotropic etch is preferably employed to minimize the criticality of the timing of the etching procedure. Of course, other crystal orientations may be employed to produce moats 14 of different cross-sectional configuration. For example, if the substrate 10 is oriented in the 1-1-1 crystal orientation, the cross-section of the moats 14 will be generally semicircular.

As illustrated in FIGS. 1c, sufficient dielectric material 16 is then grown on the surface of the wafer to dielectrically line the moats 14 to produce the desired isolation. According to the preferred embodiment of the present invention, the dielectric material 16 comprises a silicon dioxide layer of about ½ to 1 micron (5000 A to 10,000 A). This silicon dioxide layer 16 is typically grown by heating the wafer to approximately 1100° C in air for approximately 150 minutes. Next, undoped polycrystalline silicon 18 is grown to backfill the moats 14, as illustrated in FIG. 1d. In order to insure that the moats 14 are completely filled with the polysilicon 18, the polysilicon 18 is grown to a thickness of from about 5 to about 8 microns. This is preferably accomplished by placing the wafer in a reactor at about 1050° C for approximately 9 minutes. As illustrated in FIG. 1b, excess polysilicon 18 will thus cover the surface of the water.

Next, the excess polysilicon 18 and silicon dioxide 16 on the surface of the wafer is removed to expose the surface of the substrate 10 at the future sites of the transistors for further processing, while leaving the moats 14 lined with silicon dioxide 16 and filled with polysilicon 18, as illustrated in FIG. 1e. To this end, the excess polysilicon 18 on the surface of the wafer is lapped or polished down to the oxide layers 12 and 16. It is noteworthy that the desired buried collector isolation regions and the overlying epitaxial layer are as yet unformed. Thus, the criticality of the lapping or polishing operation is minimized. Specifically, any error in parellelism between the surfaces of the polishing plates and/or the surfaces of the wafer will merely result in the polishing away of the oxide layers 12 and 16 and perhaps some minor polishing away of the surface of the substrate 10. Since the buried collector isolation regions and the epitaxial layer are as yet unformed, minor polishing of the surface of the substrate 10 will be non-destructive but will merely slightly diminish the depth of the dielectric moats 14. As will be more readily apparent hereinafter, the depth of the dielectric moats 14 is not critical as the process of the present invention disposes the isolation regions relatively close to the surface of the wafer. After the lapping or polishing, the remnants of the oxide layers 12 and 16 are etched off the surface of the wafer in a conventional manner to expose the planar surface of the substrate 10 with the desired isolation moats 14 now formed, dielectrically lined and filled, as illustrated in FIG. 1e.

Formation of the desired buried collector isolation layers or regions at the transistor sites defined by the surrounding moats 14 is now accomplished. Specifically, a silicon dioxide layer 20 of sufficient thickness to prohibit diffusion therethrough is grown on the surface of the substrate 10 in a conventional manner, as illustrated in FIG. 1f. Typically, oxide layer 20 should be at least 7000A thick. By a conventionally photoresist and etch technique, apertures corresponding to the desired buried collector isolation layers are formed in the oxide layer 20 at the transistor sites defined interior of the isolation moats 14, as illustrated in FIG. 1g. Low resistivity or highly doped collector isolation layers 22 of the opposite polarity from the substrate 10 are then diffused into the substrate 10 through the apertures in the oxide mask 20. In the preferred embodiment depicted in FIGS. 1a through 1i, the substrate 10 is of P polarity, so that N type dopant is diffused to form N+ isolation regions 22. Typically, the sheet or surface resistivity, referred to as rho of the isolation regions 22 is from about 10 to about 40 ohms/cm$^2$. This may be accomplished by diffusing N type dopant at approximately 1250° C for about 45 minutes. The oxide diffusion mask 20 is then stripped in a conventional manner to expose the surface of the substrate 10 with the junction isolation regions 22 and the dielectric isolation moats 14 formed as desired, as illustrated in FIG. 1h. This may typically be accomplished by immerging the wafer in a solution of 1 part hydroflouric acid to 10 parts water at room temperature for approximately 7 minutes.

The procedure of the present method next involves the growth of epitaxial layers above the surfaces of the substrate 10 at the isolation regions 22. In order to preserve a generally planar surface and insure lateral dielectric isolation, dielectric material of a similar thickness must also be grown above the dielectric isolation moats 14. According to the preferred embodiment of the present invention, dielectric material is first grown above the moats 14, and then selective epitaxial growth is accomplished to form epitaxial layers only at the isolation regions 22.

Referring to FIG. 1i, a silicon dioxide layer approximately 1200 angstroms in thickness is grown on the surface of the wafer in a conventional manner. A layer of undoped polycrystalline silicon 32 approximately 1 micron in thickness is then grown on the surface of the oxide layer 30 in a conventional manner, as illustrated in FIG. 1j. Another silicon dioxide layer 34 approximately 1 micron in thickness is then grown on the surface of the polysilicon layer 32 in a conventional manner, as illustrated in FIG. 1k. Apertures are formed in the three dielectric layers 30, 32 and 34 by a conventional photo-resist mask and etch technique to reveal the surface of the wafer at the isolation regions 22, as illustrated in FIG. 1l. Accordingly, multi-layered dielectric plateaus or mesas having generally vertical sidewalls of approximately 2 microns in total thickness are formed above dielectric isolation moats 14.

The wafer is then placed in an epitaxial reactor under suitable conditions to promote selective epitaxial growth only at the regions of the wafer exposed through the apertures, corresponding to the isolation regions 22. Thus, desired epitaxial layers 36 having a thickness substantially corresponding to the thickness of the dielectric mesas, namely 2 microns, will be formed in the apertures. The surface of the wafer will be rendered generally planar with the desired epitaxial layers 36 laterally isolated by the dielectric mesas formed by the dielectric layers 30, 32 and 34.

The selective epitaxial growth thus required may be achieved by placing the wafer in an epitaxial reactor at a temperature of approximately 1100° C in accordance with the following procedures. First, the reactor is purged with nitrogen gas for approximately three minutes at a flow rate of approximately three minutes at a flow rate of approximately 60 liters per minute. Next, the reactor is purged with hydrogen for approximately three minutes at a flow rate of approximately 60 liters per minute. The surface of the wafer is then prepared for selective epitaxial growth by introducing HCl etchant gas at a flow rate of approximately 1 liter per minute. The HCl removes any residual oxide from the exposed surface of the semi-conductor at the isolation regions 22 while inhibiting epitaxial growth on the dielectric mesas. A mixture of hydrogen, silicon tetrachloride and dopant material is then introduced into the epitaxial reactor at suitable flow rates to achieve an epitaxial deposition rate of approximately 0.8 microns per minute. The flow rate of dopant is selected to achieve a resistivity of approximately 0.4 to 0.6 ohms per centimeter for the epitaxial layer 36. Since the desired thickness of the epitaxial layer is preferably approximately 2 microns, these conditions are maintained for approximately 2½ minutes. Accordingly, epitaxial layer 36 is grown under suitable conditions to obtain epitaxial growth only at the exposed regions of semi-conductor defined by the apertures in the dielectric layers 30, 32 and 34.

The foregoing concludes the process of forming isolated regions in accordance with the desired embodiment of the present invention. Of course, the integrated circuit is as yet incomplete, there remaining the formation of the discrete semi-conductor devices and the provisions of suitable interconnections. These procedures are accomplished in a conventional manner.

While a particular embodiment of the present invention has been shown and described in detail, it is apparent that adaptations and modifications may occur to those skilled in the art. For example, in the fabrication of MOS integrated circuits, a buried isolation layer is generally unnecessary. Thus, the process of the present invention when used in an MOS integrated circuit could proceed through the step depicted in FIG. 1e. Thereafter, conventional MOS technology would be employed. Alternatively, if an epitaxial layer is desired, the process of the present invention could be used in its entirety with the omission of the formation of the underlying junction isolation layer. It is to be expressly understood that such adaptions and modifications are within the spirit and scope of the present invention as set forth in the claims.

What is claimed is:

1. A method for forming electrically-isolated regions in a semiconductor substrate of a first conductivity type comprising the steps of first, etching notches in said substrate surrounding said isolated regions, second, depositing a silicon dioxide layer on the surface of said substrate, third, growing polycrystalline silicon on the surface of said substrate to fill said notches, fourth, lapping substantially to the surface of said substrate to re-expose said substrate at said isolated regions, fifth, forming isolation junctions of opposite conductivity type in said substrate at said isolated regions, sixth, forming dielectric mesas on said notches, and seventh, selectively growing an epitaxial layer of said opposite conductivity type on the surface of said substrate only at said isolated regions between said mesas.

2. The method according to claim 1 wherein said substrate is oriented in the 1-0-0 crystal orientation.

3. The method according to claim 1 wherein the step of forming isolating junctions comprises forming a mask on the surface of said substrate having apertures defining said isolated regions and doping the surface of said substrate through the apertures in said mask to the conductivity-type opposite the conductivity-type of the substrate.

4. The method according to claim 1 wherein the thickness of said dielectric mesas substantially corresponds to the thickness of said epitaxial layer.

5. The method according to claim 1 wherein the step of forming dielectric mesas comprising successively depositing layers of silicon dioxide, polycrystalline silicon and silicon dioxide on the surface of said substrate and selectively etching said layers to re-expose the surface of said substrate at said isolated regions.

6. The method according to claim 1 wherein said step of selectivity growing an epitaxial layer comprises disposing said wafer in an epitaxial reactor, purging said reactor with nitrogen, then purging said rector with hydrogen, then treating the surface of said wafer with HCl etchant and thereafter introducing a suitable mixture of hydrogen, silicon tetrachloride and dopant material to achieve epitaxial deposition at a rate of about 0.8 microns per minute.

7. The method according to claim 1 wherein said semiconductor devices are bipolar transistors.

* * * * *